United States Patent
Hwang et al.

(10) Patent No.: US 10,162,028 B2
(45) Date of Patent: Dec. 25, 2018

(54) LOW MAGNETIC FIELD, ULTRA-LOW MAGNETIC FIELD NUCLEAR MAGNETIC RESONANCE AND MAGNETIC RESONANCE IMAGE APPARATUS

(71) Applicant: Korea Research Institute of Standards and Science, Daejeon (KR)

(72) Inventors: Seong-min Hwang, Daejeon (KR); Kiwoong Kim, Daejeon (KR); Kwon-Kyu Yu, Daejeon (KR); Seong-Joo Lee, Daejeon (KR); Jeong-Hyun Shim, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 781 days.

(21) Appl. No.: 14/618,535

(22) Filed: Feb. 10, 2015

(65) Prior Publication Data
US 2016/0209482 A1    Jul. 21, 2016

(30) Foreign Application Priority Data
Jan. 15, 2015   (KR) .................. 10-2015-0007167

(51) Int. Cl.
*G01R 33/44* (2006.01)
*G01R 33/3815* (2006.01)
(Continued)

(52) U.S. Cl.
CPC ......... *G01R 33/445* (2013.01); *G01R 33/326* (2013.01); *G01R 33/3815* (2013.01); *G01R 33/34023* (2013.01)

(58) Field of Classification Search
CPC G01R 33/445; G01R 33/326; G01R 33/3815; G01R 33/34023
(Continued)

(56) References Cited

U.S. PATENT DOCUMENTS 8,350,568 B2    1/2013 Hwang et al.
8,838,200 B2    9/2014 Good
(Continued)

FOREIGN PATENT DOCUMENTS

JP       2011-521760    7/2011
KR    10-2010-0076150    7/2010
(Continued)

OTHER PUBLICATIONS

Hwang, Seong-min, et al. "Type-I superconductor pick-up coil in superconducting quantum interference device-based ultra-low field nuclear magnetic resonance." Applied Physics Letters 104.6 (2014): 062602.*
(Continued)

*Primary Examiner* — Rishi Patel
(74) *Attorney, Agent, or Firm* — Jenkins, Wilson, Taylor & Hunt, P.A.

(57) ABSTRACT

Provided is a low magnetic field and ultra-low magnetic field NMR and MRI apparatus. The low magnetic field and ultra-low magnetic field NMR and MRI apparatus includes a SQUID sensor and a prepolarization magnetic field coil. The prepolarization magnetic field coil generates a prepolarization magnetic field to polarize a sample. The prepolarization magnetic coil generates a counter pulse in a direction opposite to that of the prepolarization magnetic field immediately before or immediately after the prepolarization magnetic field is generated. The counter pulse demagnetizes wanted magnetization including that of the prepolarization magnetic field coil itself.

12 Claims, 9 Drawing Sheets

(51) Int. Cl.
*G01R 33/32* (2006.01)
*G01R 33/34* (2006.01)

(58) Field of Classification Search
USPC ......... 324/303, 307, 309, 318, 322; 505/162
See application file for complete search history.

(56) References Cited

U.S. PATENT DOCUMENTS

| | | | |
|---|---|---|---|
| 2004/0066194 A1* | 4/2004 | Slade | G01R 33/3808 324/318 |
| 2006/0091881 A1* | 5/2006 | Clarke | G01R 33/326 324/301 |
| 2012/0092007 A1* | 4/2012 | Li | G01F 1/716 324/306 |
| 2013/0241551 A1 | 9/2013 | Kim et al. | |
| 2014/0343397 A1 | 11/2014 | Kim et al. | |

FOREIGN PATENT DOCUMENTS

| | | |
|---|---|---|
| KR | 10-2011-0031723 | 3/2011 |
| KR | 10-2011-0076150 A | 7/2011 |
| KR | 10-2012-0055087 | 5/2012 |
| KR | 10-2013-0088247 | 8/2013 |

OTHER PUBLICATIONS

Vesanen, et al., "Hybrid Ultra-Low-Field MRI and Magnetoencephalography System Based on a Commercial Whole-Head Neuromagnetometer," Magnetic Resonance in Medicine, vol. 69, pp. 1795-1804 (2013).

\* cited by examiner

LOW MAGNETIC FIELD, ULTRA-LOW MAGNETIC FIELD NUCLEAR MAGNETIC RESONANCE AND MAGNETIC RESONANCE IMAGE APPARATUS

CROSS-REFERENCE TO RELATED APPLICATION

This U.S. non-provisional application is a continuation of and claims priority under 35 U.S.C. § 119 to Korea Patent Application No. 10-2015-0007167 filed on Jan. 15, 2015, the entirety of which is hereby incorporated by reference.

BACKGROUND

1. Technical Field

The subject matter disclosed herein generally relates to a low magnetic field and an ultra-low magnetic field nuclear magnetic resonance and magnetic resonance image apparatus. More specifically, the subject matter disclosed herein is directed to a low magnetic field and an ultra-low magnetic field nuclear magnetic resonance and magnetic resonance image apparatus using a prepolarization magnetic field coil of a type-II superconductor.

2. Related Art

Nuclear magnetic resonance (hereinafter referred to as "NMR") is a phenomenon involved with precession of the magnetic spin of an atomic nucleus arising from resonance of the magnetic spin of the nucleus under a magnetic field when the magnetic field is applied to the atomic nucleus. Magnetic resonance imaging (hereinafter referred to as "MRI") is a non-invasive technique of imaging the inner part of a target object by detecting electromagnetic waves generated during the precession using the NMR. The MRI is widely used as a medical diagnostics tool to image the inner part of human body.

Sensitivity of an MRI image is in proportional to to amount of magnetization and precession frequency. In general, very strong main magnetic field (main magnetic field; B0) using a superconducting magnet is applied to the target material to improve the sensitivity of the MRI image, since this strong magnetic field increases both the magnetization and the precession frequency.

Relaxation time of an NMR signal is in inverse proportion to uniformity of B0. Therefore, both magnitude and uniformity of B0 are important.

A superconducting magnet capable of generating a uniform magnetic field in the order of several Tesla (T) is very expensive. In addition, operation of the superconducting magnet requires liquid helium, which is an expensive refrigerant. Thus, the maintenance cost of an MRI system using the superconducting magnet increases.

Low/very low magnetic field NMR and MRI (hereinafter integrally referred to as "low magnetic field MRI") is a novel MRI concept with an operating magnetic field in the order of microtesla to hundreds of microtesla. In a conventional MRI apparatus, both magnetization and precession frequency are increased, with strong B0, to improve sensitivity. However, in low magnetic field MRI, the requirement of main magnetic field is split into prepolarization magnetic field (Bp) and measurement magnetic field (Bm). The measurement magnetic field (Bm) may have a magnitude of several microtesla (uT) to tens of uT.

The low magnetic field MRI sequentially applies prepolarization magnetic field (Bp) and measurement magnetic field (Bm) to the sample. The prepolarization magnetic field (Bp) magnetizes the sample before being ramped down to zero. The prepolarization magnetic field (Bp) is significantly stronger than the measurement magnetic field (Bm) in order to magnetize the sample sufficiently. When the prepolarization magnetic field (Bp) is ramped down to zero, polarized nuclei spins precess around the measurement magnetic field (Bm). Thus, the precessing spins generate a time-varying magnetic field, which is then measured.

The prepolarization magnetic field (Bp) and the measurement magnetic field (Bm) are applied using separate coils independent of each other. The prepolarization magnetic field (Bp) is generated by a prepolarization magnetic field coil, and the measurement magnetic field (Bm) is generated by a measurement magnetic field coil. The prepolarization magnetic field (Bp) requires a strong magnetic field for sample magnetization, without the need for high field uniformity. The measurement magnetic field (Bm), on the other hand, requires a uniform magnetic field with low field magnitude. Thus, the low magnetic field MRI consists of a system with much simpler structure with lower manufacturing cost than conventional high magnetic field MRI using a superconductor main magnet.

With a low measurement magnetic field (Bm), a low-frequency spin precession in the order of tens of hertz (Hz) to hundreds of Hz. In conventional high magnetic field MRI, Faraday induction coils are used as receiver coils to measure the spin precession. Signal-to-noise ratio (SNR) of the Faraday induction coil is proportional to the measured signal frequency. For this reason, the Faraday induction is not suitable in measuring the low-frequency signal from the low magnetic field MRI. Thus, the low magnetic field MRI may use a superconducting quantum interference device (hereinafter referred to as "SQUID") magnetic sensor that measures the time-varying magnetic field from the precessing spins directly to improve a low signal-to-noise ratio (SNR) of the Faraday induction coil, since the SQUID magnetic sensor has a flat frequency response characteristics.

Low magnetic field MRI may operate in a magnetic field in the order of microtesla using the SQUID. The low magnetic field MRI can image interior of an object from resonance signal with several to hundreds of Hz bandwidth, which is proportional to the magnitude of the measurement magnetic field (Bm). The low magnetic field MRI can significantly reduce distortion of an imagedue to magnetic artifact from surrounding metal. Thus, the low magnetic field MRI can observe a phenomenon that cannot be observed by a conventional high magnetic field MRI. In the conventional high magnetic field MRI, sample magnetization can be saturated and thus soft issue cancer cannot be identified without assistance of contrast agents. However, the low magnetic field MRI can image soft issue cancer without contrast agents.

The low magnetic field MRI can also be used reasonably on people wearing metallic prostheses or cardiac pacemakers. In addition, the low magnetic field can obtain images inside metal cans non-invasively. Thus, the low magnetic field MRI can be used as apparatuses supplementing X-ray devices widely used in security imaging.

The low magnetic field MRI may include a prepolarization magnetic field coil to magnetize a sample, a measurement magnetic field coil to induce nuclear precession from the magnetized sample, a SQUID magnetic sensor to read magnetic resonance signal from the nuclear precession, and a cooling system to cool the SQUID magnetic sensor to its operating temperature, which should be lower than the critical temperature of the superconductor comprising the sensor.

In low magnetic field MRI using a SQUID sensor, the prepolarization magnetic field coil may be made of superconductor. Superconductors are classified into two types, called Type-I and Type-II, based on their superconducting-to-normal transition when exposed to strong magnetic field. Lead (Pb) and tantalum (Ta), for example, are Type-I superconductors.

Conventionally, Type-II superconductors include metal alloys or oxide ceramics. Most high-temperature superconductors are Type-II superconductors. Niobium-titanium (NbTi), niobium-tin ($Nb_3Sn$), and magnesium diboride ($MgB_2$), for example, are metal alloy based Type-II superconductors.

There are some pure metal type-II superconductors like niobium (Nb), vanadium (V), and technetium (Tc). Oxide ceramic based Type-II superconductors include ReBCO (rare-earth-barium-copper-oxide) such as BSCCO and YBCO (yttrium-barium-copper-oxide).

For low magnetic field MRI, type-II superconductors are more economical, better in their physical properties, and have superior superconducting characteristics such as critical current and critical magnetic field than type-I superconductors.

A prepolarization magnetic field coil using superconductor is disclosed in Korean Patent Publication No. 10-2010-0076150. Since current density of a superconductor prepolarization magnetic field coil can be at least 100 times higher than that of a typical copper conductor coil, stronger magnetic field can be generated with less turns. In addition, the prepolarization magnetic field coil can be much smaller than a copper conductor coil. The superconductor prepolarization coil can operate at liquid helium temperature, whether the polarization coil conductor is a high-temperature superconductor or a low-temperature superconductor. Thus, a superconducting prepolarization coil can be integrated into the dewar containing the SQUID sensor.

None of known type-I superconductors have critical field strong enough to be used in a prepolarization magnetic field coil. For example, critical magnetic field of lead (Pb) is about 81 mT. Therefore, type-I superconductors are not suitable for prepolarization coils that generate a considerably high magnetic field in the order of tens to hundreds of mT, where self-field generated inside the conductor can be up to several times the desired magnetic field .

On the other hand, type-II superconductors have very high critical magnetic field. For example, critical magnetic field of NbTi is around 15 T. Unlike in type-I superconductors, however, t magnetic flux starts to penetrate the bulk of the superconductor at a relatively low magnetic field in type-II superconductors and the flux remain penetrating even when the magnetic field is removed, which is known as flux pinning phenomenon. This threshold field is known as the first critical magnetic field. The first critical magnetic field is lower than the critical field of a similar Type-I superconductor. Accordingly, when a type-II superconductor is used in a prepolarization magnetic field coil, the prepolarization magnetic field coil itself may be magnetized by the trapped magnetic flux from the strong prepolarization magnetic field and deteriorate resulting NMR signal. A method to remove trapped magnetic flux caused by superconducting magnetization hysteresis is required when the prepolarization magnetic field coil is made of type-II superconductor in order to prevent unwanted deterioration in NMR signal.

SUMMARY

A subject matter of the subject matter disclosed herein is to overcome NMR signal deterioration caused by a prepolarization magnetic field coil made of type-II superconductor.

A low magnetic field and ultra-low magnetic field NMR and MRI apparatus according to an embodiment of the subject matter disclosed herein includes a SQUID sensor and a prepolarization magnetic field coil. The prepolarization magnetic field coil may generate a prepolarization magnetic field to polarize a sample. The prepolarization magnetic coil may generate a counter pulse in a direction opposite to that of the prepolarization magnetic field immediately before or immediately after the prepolarization magnetic field is generated. The counter pulse may demagnetize unwanted magnetization due to the prepolarization magnetic field.

In example embodiments of the subject matter disclosed herein, the prepolarization magnetic field coil may be a Type-II superconductor, and the counter pulse may demagnetize the prepolarization magnetic field coil itself.

In example embodiments of the subject matter disclosed herein, the prepolarization magnetic field coil may be based on NbTi, $Nb_3Sn$, Nb, PbSn, $MgB_2$, BSCCO, YBCO or ReBCO.

In example embodiments, the low magnetic field and ultra-low magnetic field NMR and MRI apparatus may further include a pick-up coil adapted to measure nuclear magnetic resonance (NMR) signal from the sample as an integral part of the SQUID sensor. The pick-up coil may be made of type-II superconductor, and the pick-up coil may be demagnetized by the counter pulse of the prepolarization magnetic field coil.

In example embodiments of the subject matter disclosed herein, the pick-up coil may be based on NbTi, $Nb_3Sn$, Nb, PbSn, $MgB_2$, BSCCO, YBCO or ReBCO.

In example embodiments of the subject matter disclosed herein, a magnitude of the counter pulse may be set such that magnetization (M) is close to zero at an M-H magnetization loop in a zero magnetic field (H).

A low magnetic field and ultra-low magnetic field NMR and MRI apparatus according to an embodiment of the subject matter disclosed herein includes a SQUID sensor and a prepolarization magnetic field coil. In an operating method of the low magnetic field and ultra-low magnetic field NMR and MRI apparatus, the prepolarization magnetic field coil may generate a prepolarization magnetic field to magnetize a sample. The prepolarization magnetic coil may generate a counter pulse in a direction opposite to that of the prepolarization magnetic field immediately before or immediately after the prepolarization magnetic field is generated. The counter pulse may demagnetize unwanted magnetization due to the prepolarization magnetic field.

In example embodiments of the subject matter disclosed herein, the prepolarization magnetic field coil may be made of type-II superconductor, and the counter pulse may demagnetize the prepolarization magnetic field coil itself.

In example embodiments of the subject matter disclosed herein, the prepolarization magnetic field coil may be based on NbTi, $Nb_3Sn$, Nb, PbSn, $MgB_2$, BSCCO, YBCO or ReBCO.

In example embodiments of the subject matter disclosed herein, the low magnetic field and ultra-low magnetic field NMR and MRI apparatus may further include a pick-up coil adapted to measure nuclear magnetic resonance (NMR) signal from the sample as an integral part of the SQUID sensor. The pick-up coil may be made of type-II superconductor, and the pick-up coil may be demagnetized by the counter pulse of the prepolarization magnetic field coil.

In example embodiments of the subject matter disclosed herein, the pick-up coil may be based on NbTi, Nb$_3$Sn, Nb, PbSn, MgB$_2$, BSCCO, YBCO or ReBCO.

In example embodiments of the subject matter disclosed herein, a magnitude of the counter pulse may be set such that magnetization (M) is close to zero at an M-H magnetization loop in a zero magnetic field (H).

BRIEF DESCRIPTION OF THE DRAWINGS

The subject matter disclosed herein will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the subject matter disclosed herein.

DETAILED DESCRIPTION

Figure 1A:
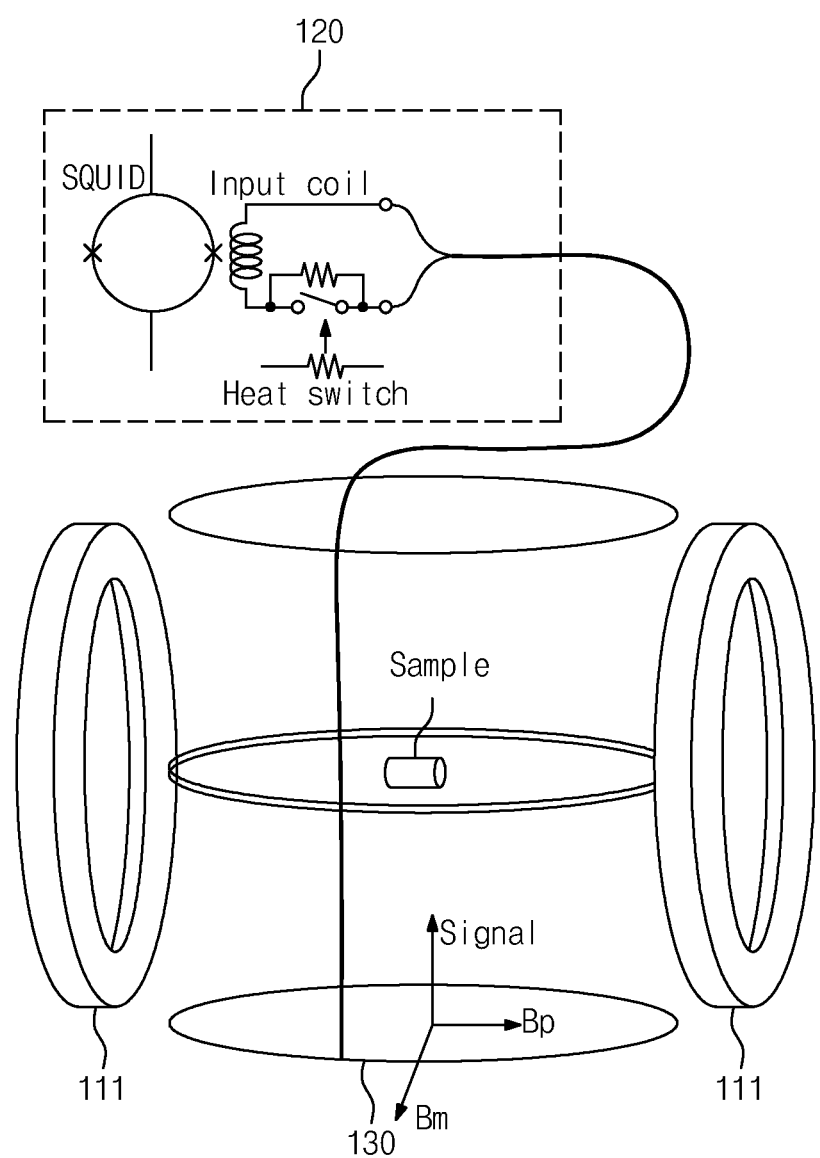
FIG. 1A is a schematic diagram of a test apparatus according to an embodiment of the subject matter disclosed herein.

According to an embodiment of the subject matter disclosed herein, there is disclosed a method for suppressing NMR signal distortion by applying a counter pulse of an opposite direction to a prepolarization magnetic field to the prepolarization magnetic field to prevent magnetic field distortion caused by hysteresis when a Type-II superconductor is used as a prepolarization magnetic field coil.

A similar problem also occurs at a pick-up coil using a Type-II superconductor. A pick-up coil using a superconductor will be described first.

In low magnetic field MRI, a superconductor pick-up coil is an important component of a SQUID sensor to precisely measure a magnetic field.

In the low magnetic field MRI, a sample to be inspected is magnetized first by a strong prepolarization magnetic field. Conventionally, the magnitude of the prepolarization magnetic field is 20 mT or greater. Thereafter, a weak measurement magnetic field (Bm) in the order of 1 to 100 μT is used to generate nuclear spin precession. The SQUID sensor is the most practical way to measure an extremely weak low-frequency NMR signal from the precessing nuclear spins.

A pick-up coil is connected to an input coil inductively coupled to a SQUID ring to form a superconducting loop.

The superconducting loop functions as a flux transformer to transform a magnetic flux passing through an area defined by the pick-up coil to the SQUID ring without loss.

The SQUID is shielded itself from a parasitic magnetic field. In particular, the SQUID is shielded from an electromagnetic noise generated during amplification and measurement of a strong magnetic field and a magnetic flux from the prepolarization magnetic field coil.

Niobium-titanium (NbTi) and niobium (Nb) may be used as materials of a pick-up coil due to a SQUID sensor of low critical temperature. NbTi and Nb are Type-II superconductors.

Niobium-titanium (NbTi) and niobium (Nb) have two critical magnetic fields, i.e., a low first critical magnetic field Hc1 and a high second critical magnetic field Hc2. At the lower first critical magnetic field Hc1, a flux starts to penetrate the inside of a superconductor and may be trapped inside the superconductor. At the higher second critical magnetic field Hc2, the magnetic flux fully penetrates the superconductor and the material loses superconductivity.

In low magnetic field MRI, one of the technical bottlenecks impeding technical advance in the low magnetic field MRI for a long time was that a strong prepolarization magnetic field (Bp) disturbs the resulting NMR signal even after the prepolarization magnetic field (Bp) is ramped down.

According to a paper by Vesanen et al., in low magnetic field MRI, a superconducting wire is used with a niobium (Nb) filament embedded in a bronze matrix for a prepolarization magnetic field coil. In this case, Vesanen et al. reported that distortion of an MRI image (or NMR signal) occurred due to a magnetic flux trapped to a superconducting prepolarization magnetic field (Bp) coil.

Regardless of material comprising the prepolarization magnetic field (Bp) coil, a pick-up coil may be disposed adjacent to a sample to obtain a strong magnetic resonance signal. Therefore, the pick-up coil may be exposed to the strong magnetic field from the prepolarization magnetic field (Bp) coil.

If a prepolarization magnetic field (Bp) is strong enough, a portion of a pick-up coil may be exposed to a magnetic field that exceeds a first critical magnetic field Hc1 of the superconductor comprising the pick-up coil. After the prepolarization magnetic field (Bp) is removed, the magnetic flux penetrating the superconductor may be trapped inside. The trapped magnetic flux may generate an inhomogeneous remanent magnetic field in the sample space and deteriorate an NMR signal.

Magnetization characteristics of three pick-up coils were investigated. One of the three pick-up coils was made of Pb that is a type-I superconductor, and the other two pick-up coils were made of NbTi and Nb that are type-II superconductors, respectively. In order to investigate characteristics of the pick-up coil, a prepolarization magnetic field coil was made of not a superconductor but a resistive copper wire. Each of the pick-up coils was exposed to a series of prepolarization magnetic fields, and NMR signal from a water sample was measured. The pick-up coils made of the type-II superconductor obtained deteriorated NMR signals under strong prepolarization magnetic fields (Bp). Meanwhile, the Pb pick-up coil exhibited undeteriorated NMR signals under strong prepolarization magnetic fields (Bp).

A negative counter pulse after the strong prepolarization magnetic field (Bp) may be able to remove trapped magnetic flux from a type-II superconductor. Thus, the negative counter pulse can restore the deteriorated NMR signal.

Preferred embodiments of the subject matter disclosed herein will be described more fully hereinafter with reference to the accompanying drawings. This disclosure may, however, be embodied in many different forms and should not be construed as limited to the embodiments set forth herein. Rather, these embodiments are provided so that this disclosure will be thorough and complete, and will fully convey the scope of the subject matter disclosed herein to those skilled in the art. In the drawings, the size and relative sizes of regions may be exaggerated for clarity. Like numbers refer to like elements throughout.

FIG. 1A is a schematic diagram of a test apparatus according to an embodiment of the subject matter disclosed herein.

Figure 1B:
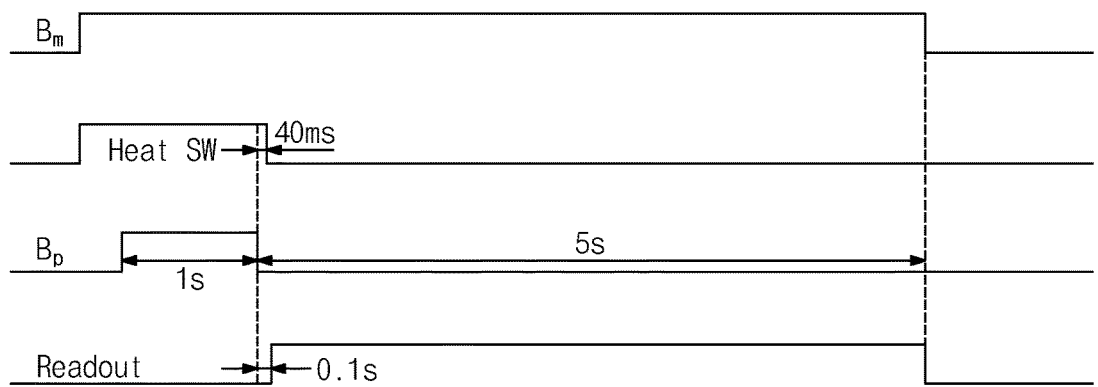
FIG. 1B illustrates an NMR pulse sequence of the test apparatus in FIG. 1A.

FIG. 1B illustrates an NMR pulse sequence of the test apparatus in FIG. 1A.

Figure 1C:
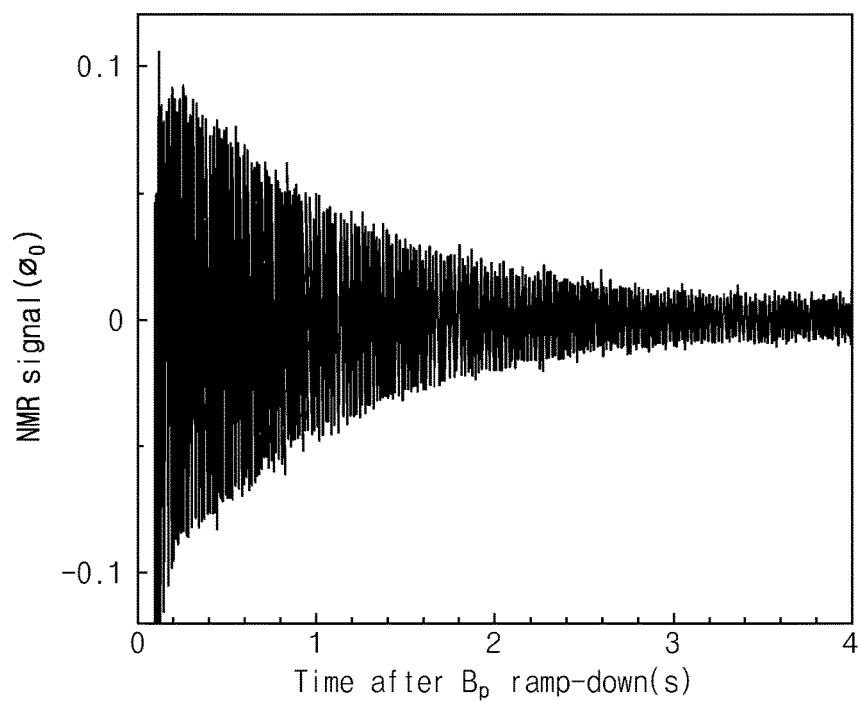
FIG. 1C is an NMR signal from the test apparatus in FIG. 1A.

FIG. 1C is an NMR signal from the test apparatus in FIG. 1A.

Figure 1D:
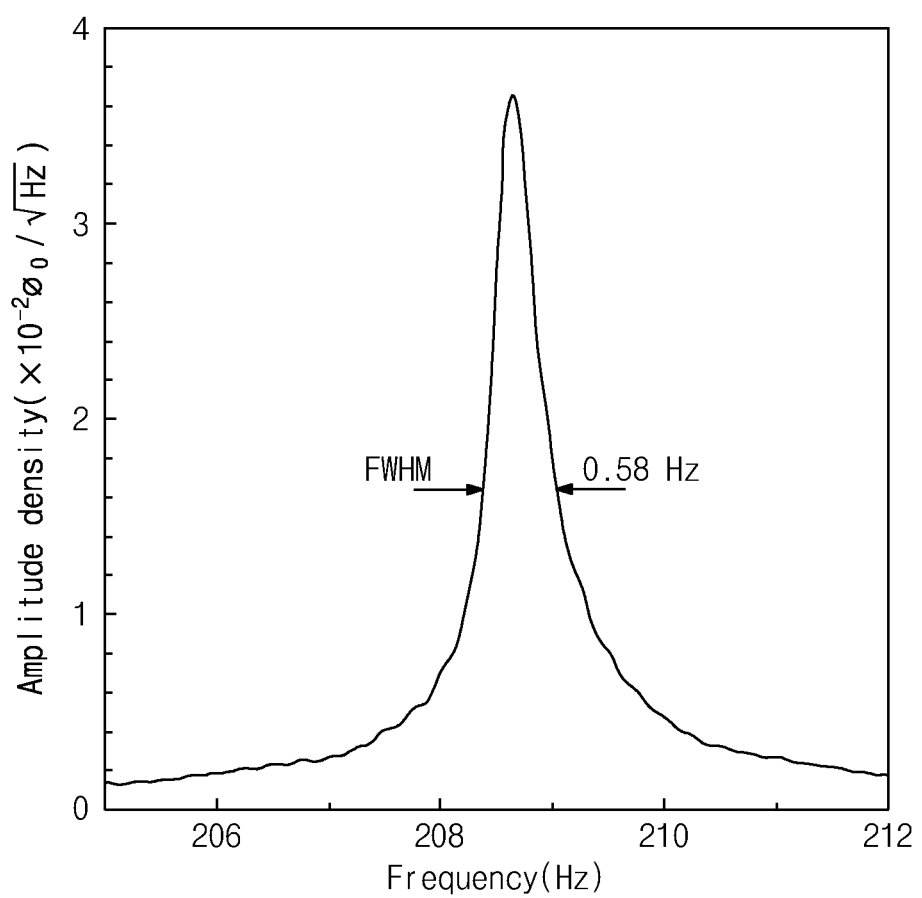
FIG. 1D is a spectral presentation of the NMR signal in FIG. 1C in frequency domain.

FIG. 1D is spectral presentation of the NMR signal in FIG. 1C in frequency domain.

Referring to FIGS. 1A and 1B, prepolarization magnetic field coils 111 are disposed at both sides of a pick-up coil 130, respectively. Three pick-up coils are all in the form of second-order axial gradiometer. Each of the pick-up coils has a diameter of 142 mm and a baseline of 86 mm. This configuration makes a pick-up coil very sensitive from a magnetic field of the prepolarization magnetic field coil 111. The prepolarization magnetic field coil 111 covers a sample space.

In this test, the prepolarization magnetic field coil 111 has an inner diameter of 120 mm and is provided in pair of 1100 turns. An enamel-coated copper wire having a diameter of 0.4 mm was used. A prepolarization magnetic field was non-adiabatically reduced with ramp-down time (trd).

An input coil heat switch was turned on until 40 ms after current ramp-down.

A measurement magnetic field Bm was generated using a pair of square coils having Helmholtz configuration.

FIG. 1C shows an NMR signal from a water sample. Detrended fluctuation analysis was used in the NMR signal to remove baseline fluctuation.

FIG. 1D shows a result of indicating the NMR signal in a frequency domain. The quality of the NMR signal was evaluated by peak spectral amplitude and spectral width. The spectral width was defined as full-width half-maximum (FWHM) of spectral amplitude density.

In a homogeneous measurement magnetic field (Bm), peak spectral amplitude increases linearly with an increasing prepolarization magnetic field (Bp) without any disturbance. On the other hand, spectral width is constantly maintained without depending on the prepolarization magnetic field (Bp).

With respect to all the three types of pick-up coils, current for generating the prepolarization magnetic field (Bp) increased from 1 to 16 amperes (A).

Figure 2:
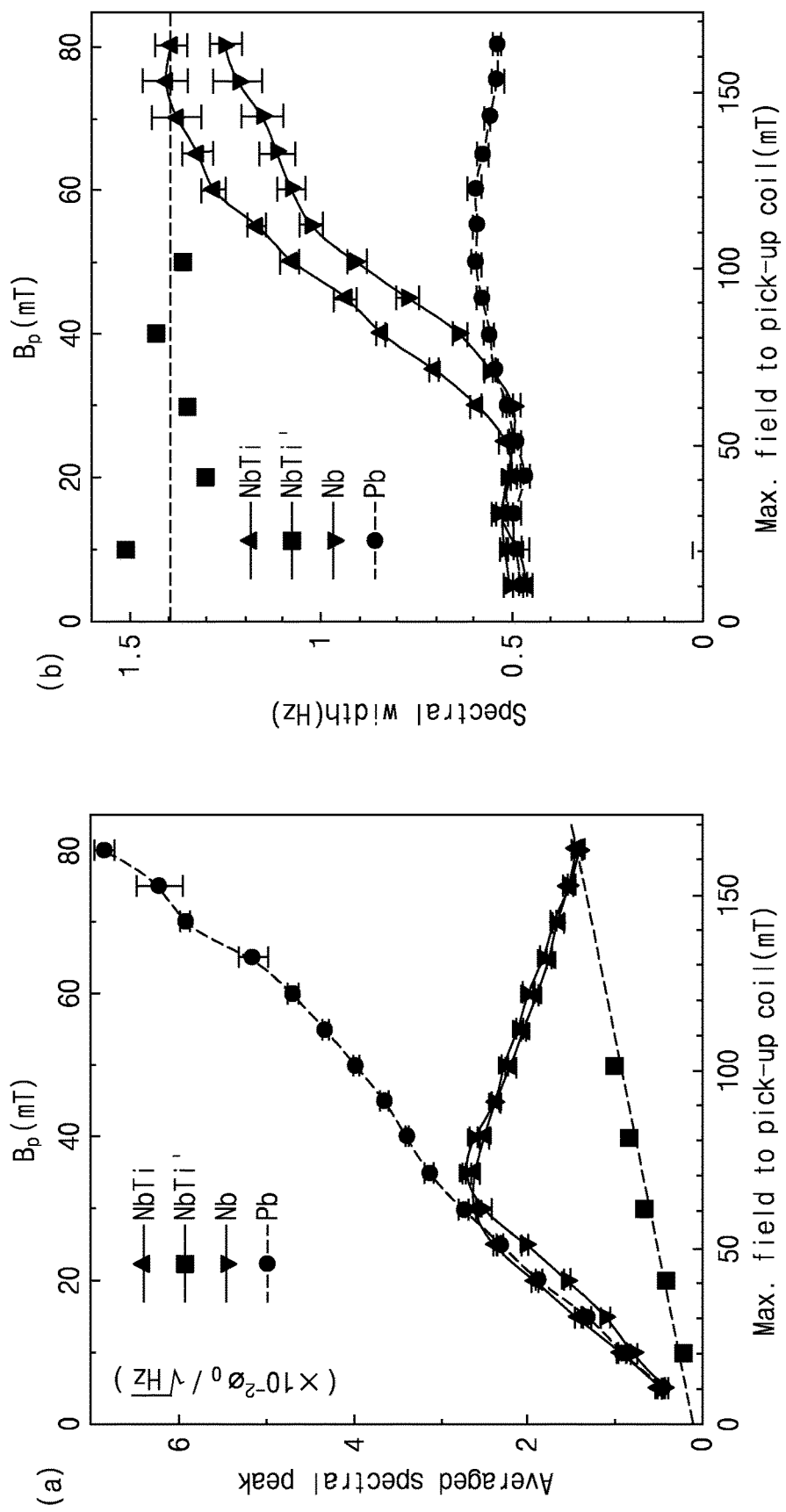
FIG. 2 illustrates peak spectral amplitude and spectral width as functions of increasing prepolarization magnetic field strength with three different pick-up coil materials.

FIG. 2 illustrates peak spectral amplitude and spectral width as functions of increasing prepolarization magnetic field strength with three different pick-up coil materials.

Referring to FIG. 2, a Pb pick-up coil was not affected even by the highest Bp current. The highest Bp current corresponds to maximum 160 mT and corresponds to median exposure of 64 mT. On the other hand, an NbTi pick-up coil exhibited signal deterioration from Bp current of 6 amperes (A). The Bp current of 6 A corresponds to maximum 61 mT and corresponds to median exposure of 24 mT.

An Nb pick-up coil exhibited signal deterioration from Bp current of 8 amperes (A). The Bp current of 8 A corresponds to maximum 82 mT and corresponds to median exposure of 32 mT.

Total NMR signal power is calculated by an area of an NMR peak below. The total NMR signal power decreases with the increasing prepolarization magnetic field (Bp). The decrease in the total NMR signal power may be explained as lack of relaxation data for dead time of 100 ms after Bp ramp-down.

After the NbTi pick-up coil was exposed to a magnetic field generated by Bp current of 16 A, the NbTi pick-up coil obtained an NMR signal under a magnetic field generated by lower Bp current (square in FIG. 2.). In this case, a harmful effect resulting from a magnetic field generated by the Bp current of 16 amperes (A) continued and was not removed with the lapse of time. For example, even after a day has passed, the NbTi pick-up coil obtained a deteriorated NMR signal under the magnetic field generated by the lower Bp current.

When a pick-up coil was cooled in liquid helium after being taken out of the liquid helium and heated in the air, the pick-up coil exhibited the same result as an initial sequence.

Thus, if the NMR signal deterioration is caused by pick-up coil magnetization from fix pinning, application of negative Bp (counter pulse) may demagnetize a pick-up coil and remove a harmful effect. The negative Bp (counter pulse) may be generated by a Bp coil with current in an opposite direction immediately after a strong Bp pulse.

Figure 3:
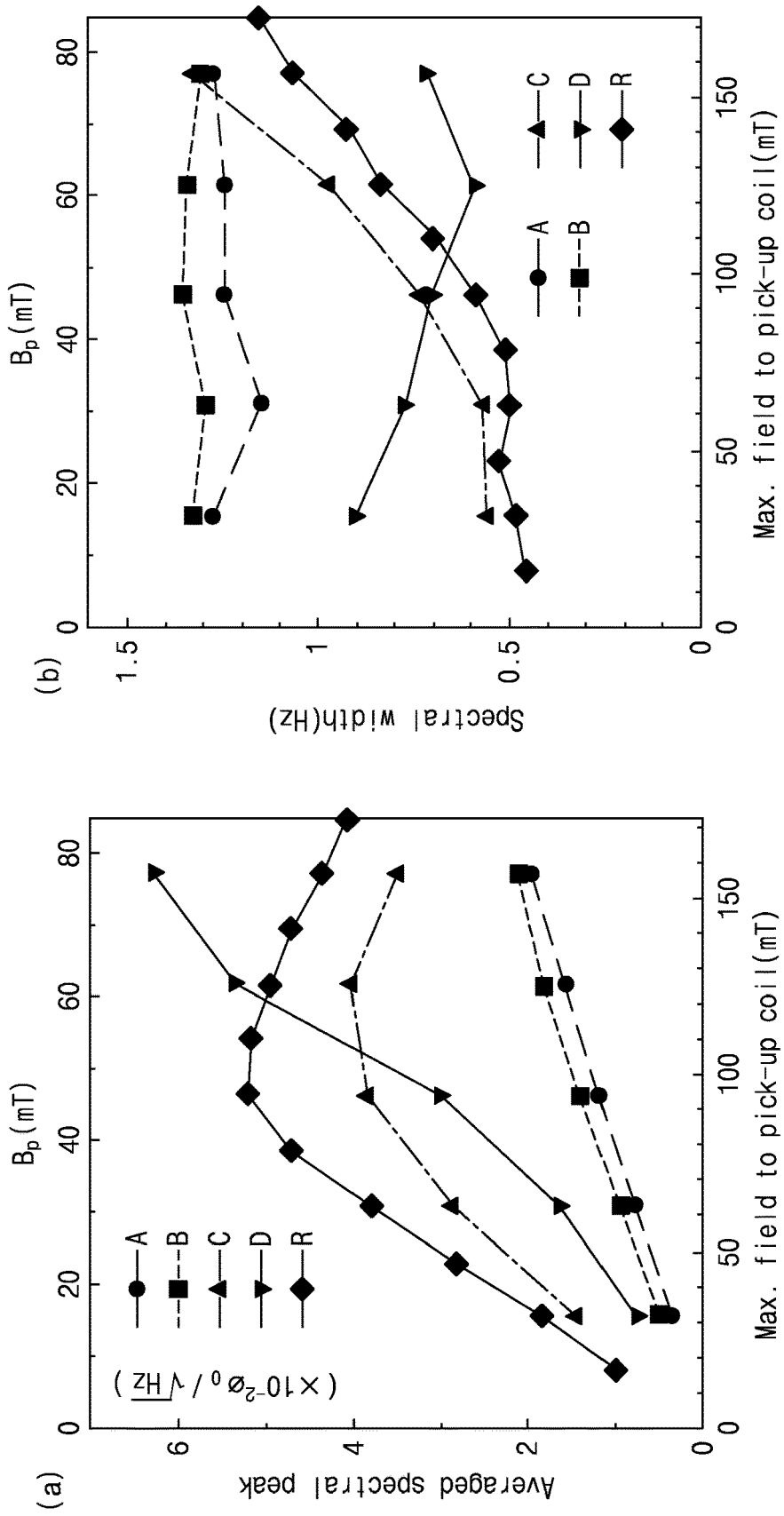
FIG. 3 illustrates peak spectral amplitude and spectral width as functions of increasing prepolarization magnetic field strength with an NbTi pick-up coil.

FIG. 3 illustrates peak spectral amplitude and spectral width as functions of increasing prepolarization magnetic field strength with an NbTi pick-up coil.

Referring to FIG. 3, after a strong magnetic field having Bp current of 16 amperes (A) is applied in advance, Bp currents of 2, 4, 6, 8, and 10 A are applied to the NbTi pick-up coil in an increasing order.

In case of (A), immediately after the Bp current of 16 A was applied, a counter pulse was not applied. In case of (B), after the Bp current of 16 A was applied in advance, a counter pulse of −3 A was applied with a delay of 30 seconds. In case of (C), after the Bp current of 16 A was applied in advance, a counter pulse of −11 A was applied with a delay of 30 seconds. In case of (D), after the Bp current of 16 A was applied in advance, a counter pulse of −15 A was applied with a delay of 30 seconds. In case of (R), an NMR signal was measured without applying a strong magnetic field having the Bp current of 16 A in advance.

As the intensity of a counter pulse increases, an NMR signal is improved. However, when a counter pulse of −15 A is applied, the NMR signal is deteriorated. This is interpreted as occurring due to magnetization that is performed in an opposite direction by a counter pulse. Accordingly, there is a counter pulse intensity which is capable of obtaining an optimal NMR signal.

Figure 4:
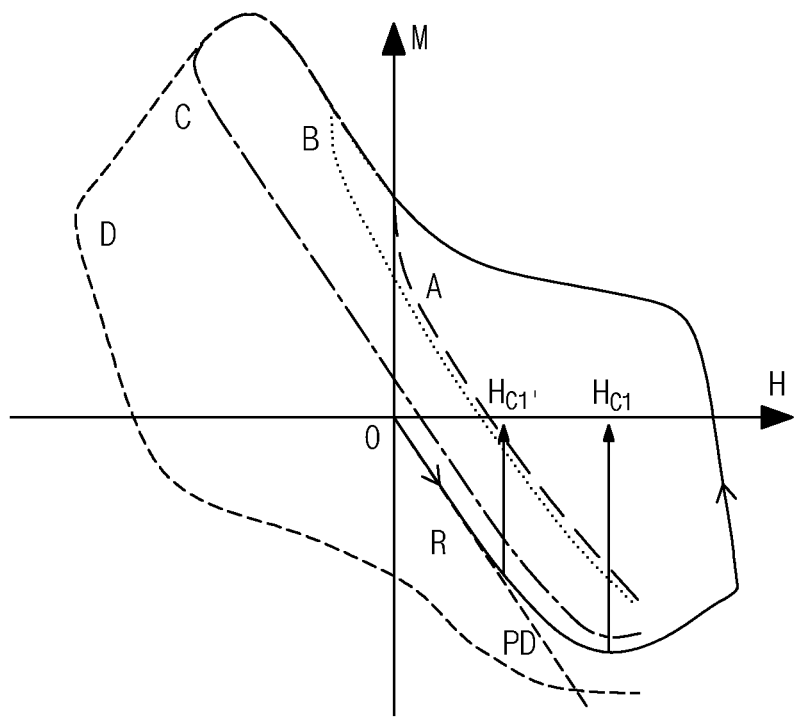
FIG. 4 is a conceptual magnetization loop illustrating magnetization characteristics of FIG. 3.

FIG. 4 is a conceptual magnetization loop illustrating magnetization characteristics of FIG. 3.

Referring to FIG. 4, the intensity of a counter pulse may be precisely controlled to demagnetize a pick-up coil. The intensity of the counter pulse may a magnetization path to pass through the origin of an M-H curve. An NMR sequence may be changed to include a counter pulse.

Magnetization loop characteristics of a Type-II superconductor will now be described below.

A strong prepolarization magnetic field (Bp) is an important component of an ultra-low field nuclear magnetic resonance (ULF-NMR) and magnetic resonance imaging (MRI) system. Unlike conventional NMR/MRI using a strong main magnetic field ($B_0$) to polarize a sample, the prepolarization magnetic field (Bp) need to be fully removed in ULF-NMR/MRI for a ramp-down time of the level of milliseconds. Such fast ramp-down of the prepolarization magnetic field (Bp) may guarantee that a polarized sample is subordinate only to a homogeneous measurement field (Bm) during spin relaxation.

This requirement was proved to be a serious technical problem in increasing the magnitude of a prepolarization magnetic field (Bp) and developing ULF-NMR/MRI. Efforts to increase the magnitude of the prepolarization magnetic field (Bp) have focused on reduction of eddy currents around a magnetically shielded room (MSR). The eddy currents are induced by fast ramp-down of the strong prepolarization magnetic field (Bp). The eddy currents may cause a transient remanent magnetic field to be generated. The transient remanent magnetic field may distort a µT-level measurement magnetic field (Bm). Even after the prepolarization magnetic field (Bp) is ramped down, a sample space of the measurement magnetic field (Bm) must be uniform. However, in spite of an eddy current-induced remanent magnetic field reduced to an insignificant level, a strong prepolarization magnetic field (Bp) of a predetermined level or higher still causes decrease in NMR signal quality. That is, the decrease in the NMR signal quality means that there is another source to cause distortion of the measurement magnetic field (Bm).

By reacting to a strong prepolarization magnetic field, a ferromagnetic substance as well as a Type-II superconductor performing flux pinning well may distort a measurement magnetic field. Thus, the ferromagnetic substance as well as the Type-II superconductor may impede NMR and MRI operations.

Superconducting pick-up coils were investigated in SQUID-based ULF-NMR. The investigation discovered that a pick-up coil made of a Type-II superconductor was also vulnerable to flux pinning from a strong prepolarization magnetic field. The flux pinning significantly deteriorates NMR signal quality acquired through excess of a predetermined threshold prepolarization magnetic field.

On the other hand, a pick-up coil made of lead (Pb) that is a kind of Type-I superconductor did not exhibit the above problem.

A demagnetization or degaussing method in a Type-II superconductor coil will now be introduced below.

The pick-up coil 240 and the prepolarization magnetic field (Bp) coil 111 in FIG. 1 were used.

Referring to FIG. 1A, an enamel-insulated NbTi wire having a diameter of 0.127 mm was used as a Type-II superconductor. An uninsulated Pb wire having a diameter of 0.25 mm was used as a Type-I superconductor.

Pick-up coils have the same geometrical structure. The pick-up coil is a second-order axial gradiometer configuration having a diameter of 142 mm and a baseline of 86 mm.

Since a portion of a pick-up coil is exposed to maximum two times a prepolarization magnetic field (Bp) generated in a sample space, this configuration causes the pick-up coil to be vulnerable to a magnetic field from the prepolarization magnetic field (Bp).

Magnetization measurements were performed by the Quantum Design's Magnetic Property Measurement System. DC magnetic moments of the zero-field-cooled wire samples were decided at 4.2 K with the orientation of magnetic moment parallel or perpendicular to a magnetic field. Length of a wire sample was 5 mm.

The sample was prepared from the same spool as a wire used to manufacture a pick-up coil.

With respect to an NbTi wire sample, a magnetization loop was measured along a counter pulse. After having an initial ramp until 160 mT, a magnetic field decreased to 0 mT, −30 mT, −100 mT, and −150 mT, respectively. Then the magnetic field increased again to 160 mT.

With respect to a Pb wire sample, a magnetic field was swept between 160 mT and −160 mT. A field range decreased to ±80 mT to apply a vertical magnetic field to the Pb wire sample.

All initial magnetic field variations were performed through 2.5 mT-steps. Continuous magnetic field variation for a magnetization loop was performed through 10 mT-steps. With respect to each measurement, a sample was successively measured with different counter pulses through a multidirectional magnetization loop.

Figure 5:
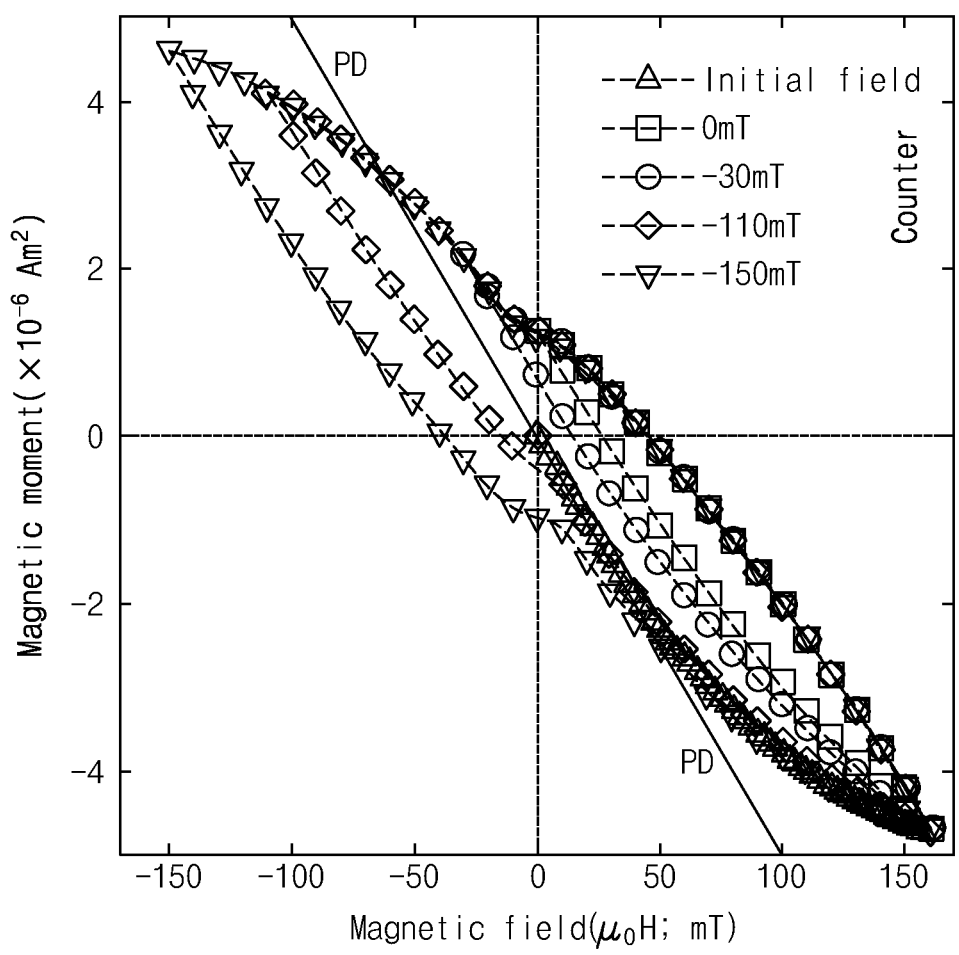
FIG. 5 illustrates a magnetization loop of an NbTi wire sample measured with a magnetic field applied horizontally to the sample.

FIG. 5 illustrates a magnetization loop of an NbTi wire sample measured with a magnetic field applied horizontally to the sample.

Referring to FIG. 5, an NbTi wire is parallel to a magnetic field and the magnetic field starts with initial magnetization between 0 mT and 160 mT.

The magnetic moments initially followed a straight line representing perfect diamagnetism, but started to diverge from the line at around 20 mT. The divergence became severe at 50 mT. The divergence means considerable amount of magnetic flux penetration into the wire.

The initial magnetization decreases to 0 mT and increases again to 160 mT and is performed by cycling of a magnetic field.

When there is no magnetic field, positive non-zero magnetic moments mean that there is considerable amount of trapped magnetic flux in a wire from initial magnetization.

Another cycling of a magnetic field of 160 mT exhibits a similar magnetization loop again at −30 mT. However, magnetic moments are slightly small in a zero magnetic field. Application of a negative magnetic field of −30 mT provides degaussing effect.

At −110 mT, additional repetition of a negative magnetic field of −150 mT proves analysis.

A negative cycle below −110 mT causes a magnetic moment as a negative value in the zero magnetic field, which means that demagnetization of a conductor is excessive. Thus, a cycle of a negative magnetic field between −30 mT and −110 mT may perfectly demagnetize the conductor by generating a zero magnetic moment in the zero magnetic field.

Figure 6:
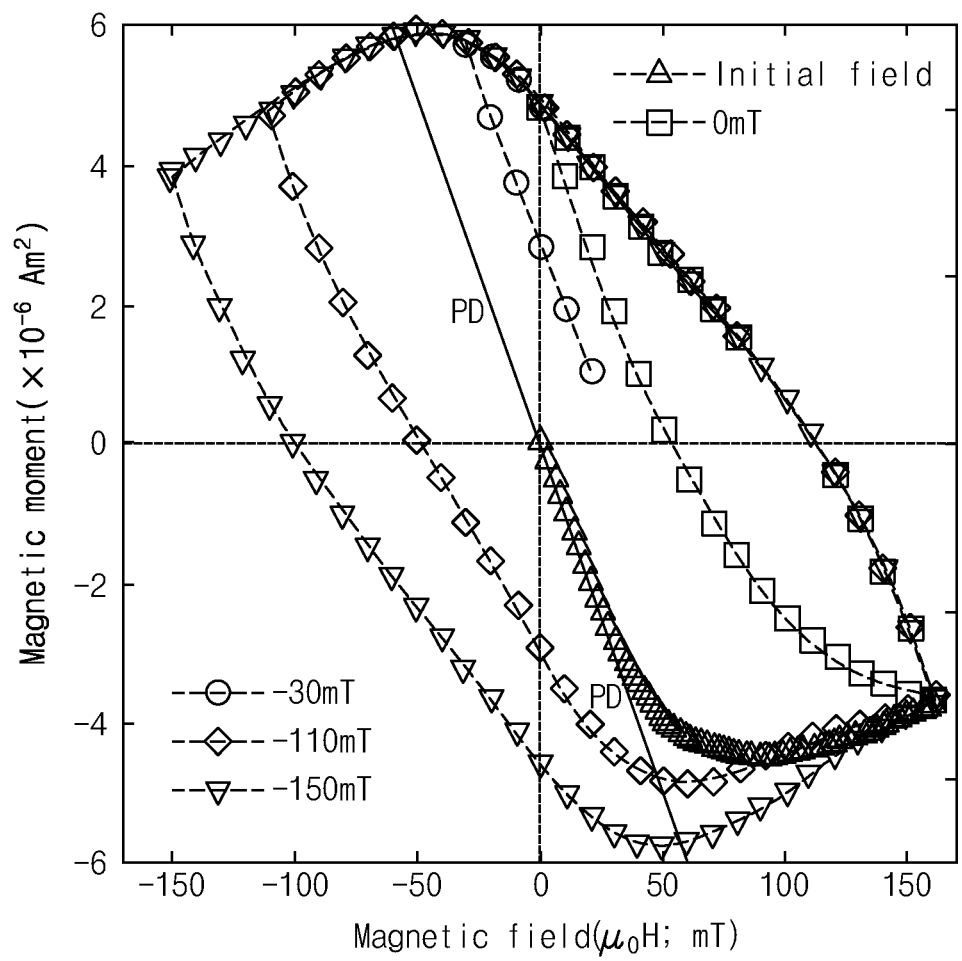
FIG. 6 illustrates a magnetization loop of an NbTi wire sample with a magnetic field applied perpendicular to the sample.

FIG. 6 illustrates a magnetization loop of an NbTi wire sample with a magnetic field applied perpendicular to the sample.

Referring to FIG. 6, application of the magnetic field perpendicular to the wire provides a certain series of magnetic loops. A deviation from perfect diamagnetism starts to be observed in a low magnetic field of 15 mT. When reaching 90 mT, a magnetic moment stops decreasing and increases with an increasing magnetic field.

This represents that a wire starts to trap a magnetic flux. The deviation from the perfect diamagnetism is made visible in a low magnetic field of 15 mT. At 90 mT, the magnetic moment stops decreasing and increases with an increasing magnetic field, which means that a larger number of magnetic fluxes are pinned than when a wire is pushed out.

Subsequent degaussing cycles are similar but wider than a magnetization loop parallel to the magnetic field. The magnetic moment is greater in the zero magnetic field than in the parallel magnetic field.

Magnetization of a pick-up coil has been investigated using a prepolarization magnetic coil made of copper. However, the prepolarization magnetic field coil may be made of a Type-II superconductor. In this case, the Type-II superconductor prepolarization magnetic coil may deteriorate an NMR signal caused by magnetization. Thus, application of a counter pulse is required when the Type-II superconductor prepolarization magnetic field coil is used. A counter pulse for demagnetizing the prepolarization magnetic field coil itself may be applied immediately before or immediately after the prepolarization magnetic field is generated. The counter pulse may demagnetize both a Type-II superconductor pick-up coil and a Type-II superconductor prepolarization magnetic field coil at the same time.

Figure 7:
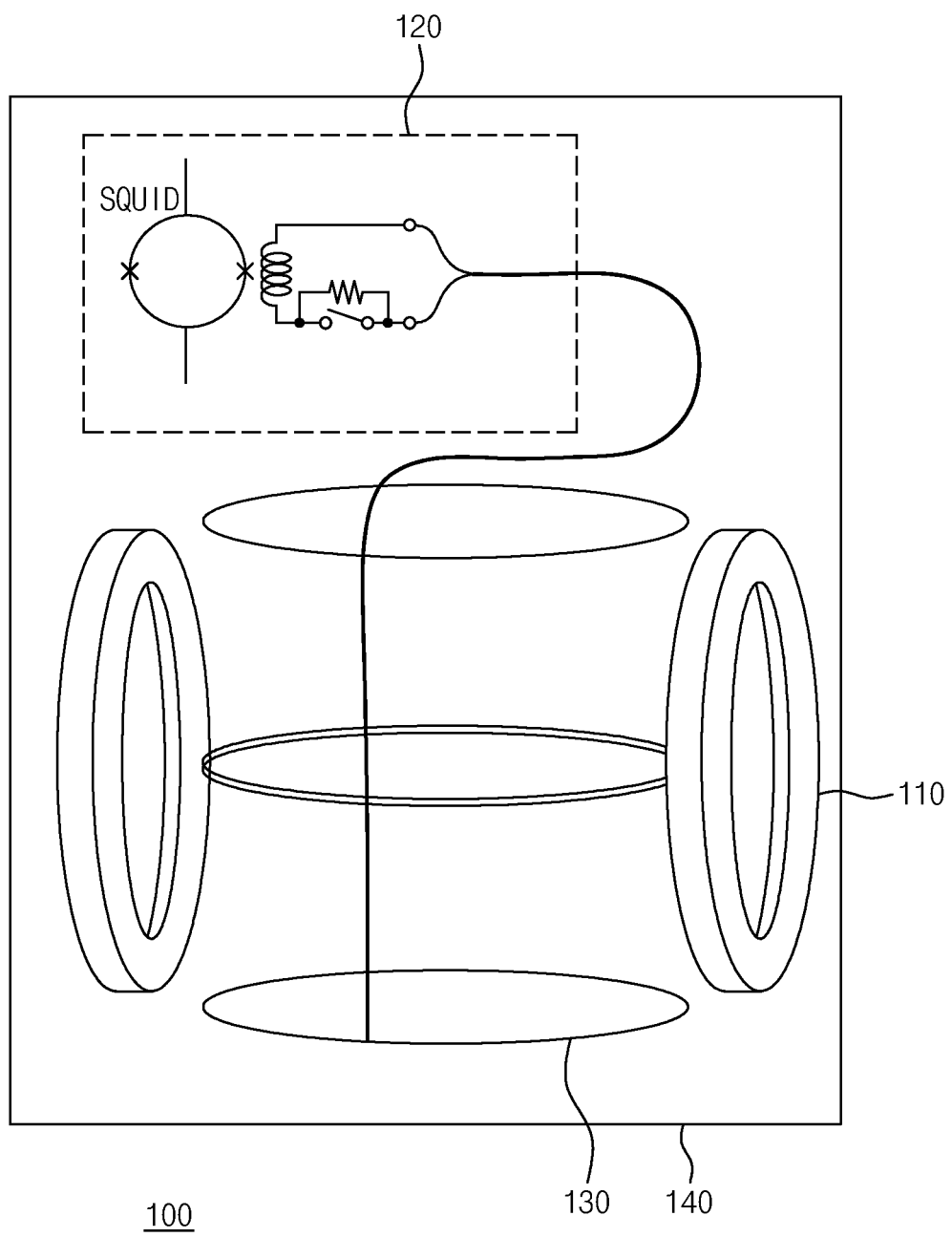
FIG. 7 illustrates a low magnetic field and ultra-low magnetic field NMR and MRI apparatus according to an embodiment of the subject matter disclosed herein.

FIG. 7 illustrates a low magnetic field and ultra-low magnetic field NMR and MRI apparatus 100 according to an embodiment of the subject matter disclosed herein.

Referring to FIG. 7, the low magnetic field and ultra-low magnetic field NMR and MRI apparatus 100 includes a SQUID sensor 120 and a prepolarization magnetic field coil 110. The prepolarization magnetic field coil 110 generates a prepolarization magnetic coil to prepolarize a sample. The prepolarization magnetic field coil 110 generates a counter pulse in a direction opposite to that of the prepolarization magnetic field immediately before or immediately after the prepolarization magnetic field is generated. The counter pulse demagnetizes unwanted magnetization due to the prepolarization magnetic field.

The prepolarization magnetic field coil 110 may be a Type-II superconductor, and the counter pulse may demagnetize the prepolarization magnetic coil 110 itself. The prepolarization magnetic field coil 110 may be based on NbTi, Nb$_3$Sn, Nb, PbSn, MgB$_2$, BSCCO, YBCO or ReBCO.

Pick-up coil 130 measures the nuclear magnetic resonance (NMR) signal from the sample to provide the SQUID sensor 120. The pick-up coil 130 is a Type-II superconductor. The pick-up coil may be demagnetized by the counter pulse of the prepolarization magnetic field coil 110. The pick-up coil may be based on NbTi, Nb$_3$Sn, Nb, PbSn, MgB$_2$, BSCCO, YBCO or ReBCO.

A magnitude of the counter pulse may be set such that magnetization (M) is close to zero at an M-H magnetization loop in a zero magnetic field (H). Preferably, the size of the counter pulse may be set to be the zero magnetization (M) at the M-H magnetization loop in the zero magnetic field (H).

The pick-up coil 130, the prepolarization magnetic field coil 110, and the SQUID sensor 120 may dip into a coolant to be cooled below a critical temperature. A Dewar 140 may store the coolant. The pick-up coil 130, the prepolarization magnetic field coil 110, and the SQUID sensor 120 may be disposed inside the Dewar 140.

As described above, a counter pulse is formed at a prepolarization magnetic field coil to demagnetize a magnetized prepolarization coil. Thus, NMR signal distortion caused by a remanent magnetic field generated by the magnetized prepolarization coil is reduced.

Although the subject matter disclosed herein has been described in connection with the embodiment of the subject matter disclosed herein illustrated in the accompanying drawings, it is not limited thereto. It will be apparent to those skilled in the art that various substitutions, modifications and changes may be made without departing from the scope and spirit of the subject matter disclosed herein.

The invention claimed is:

1. A low magnetic field and ultra-low magnetic field nuclear magnetic resonance (NMR) and magnetic resonance image (MRI) apparatus comprising:
   a SQUID sensor; and
   a prepolarization magnetic field coil,
   wherein the prepolarization magnetic field coil is adapted to generate a prepolarization magnetic field to magnetize a sample,
   wherein the prepolarization magnetic field coil is adapted to generate a counter pulse in a direction opposite to that of the prepolarization magnetic field immediately before or immediately after the prepolarization magnetic field is generated,
   wherein unwanted magnetization due to the prepolarization magnetic field is demagnetized by the counter pulse,
   wherein the prepolarization magnetic field coil is a type-II superconductor, and
   wherein the counter pulse demagnetizes the prepolarization magnetic field coil itself.

2. The low magnetic field and ultra-low magnetic field NMR and MRI apparatus of claim 1, wherein a magnitude of the counter pulse is set such that magnetization (M) is close to zero at an M-H magnetization loop in a zero magnetic field (H).

3. The low magnetic field and ultra-low magnetic field NMR and MRI apparatus of claim 1, wherein the prepolarization magnetic field coil is made from NbTi, Nb$_3$Sn, Nb, PbSn, MgB$_2$, BSCCO, YBCO, or ReBCO.

4. A low magnetic field and ultra-low magnetic field nuclear magnetic resonance (NMR) and magnetic resonance image (MRI) apparatus comprising:
   a SQUID sensor;
   a prepolarization magnetic field coil; and
   a pick-up coil adapted to measure NMR signal from the sample and provide the measured NMR signal by the pick-up coil to the SQUID sensor,
   wherein the prepolarization magnetic field coil is adapted to generate a prepolarization magnetic field to magnetize a sample,
   wherein the prepolarization magnetic field coil is adapted to generate a counter pulse in a direction opposite to that of the prepolarization magnetic field immediately before or immediately after the prepolarization magnetic field is generated,
   wherein unwanted magnetization due to the prepolarization magnetic field is demagnetized by the counter pulse,
   wherein the pick-up coil is a type-II superconductor, and
   wherein the pick-up coil is demagnetized by the counter pulse of the prepolarization magnetic field.

5. The low magnetic field and ultra-low magnetic field NMR and MRI apparatus of claim 4, wherein the pick-up coil is made from NbTi, Nb$_3$Sn, Nb, PbSn, MgB$_2$, BSCCO, YBCO, or ReBCO.

6. The low magnetic field and ultra-low magnetic field NMR and MRI apparatus of claim 4, wherein a magnitude of the counter pulse is set such that magnetization (M) is close to zero at an M-H magnetization loop in a zero magnetic field (H).

7. An operating method of a low magnetic field and ultra-low magnetic field nuclear magnetic resonance (NMR)

and magnetic resonance image (MRI) apparatus including a SQUID sensor and a prepolarization magnetic field coil, the method comprising:

generating, using the prepolarization magnetic field coil, a prepolarization magnetic field to magnetize a sample; and generating, using the prepolarization magnetic field coil, a counter pulse in a direction opposite to that of the prepolarization magnetic field immediately before or immediately after the prepolarization magnetic field is generated, wherein unwanted magnetization due to the prepolarization magnetic field is demagnetized by the counter pulse, wherein the prepolarization magnetic field coil is a type-II superconductor, and wherein the counter pulse demagnetizes the prepolarization magnetic field coil itself.

8. The operating method of claim 7, wherein a magnitude of the counter pulse is set such that magnetization (M) is close to zero at an M-H magnetization loop in a zero magnetic field (H).

9. The operating method of claim 7, wherein the prepolarization magnetic field coil is made from NbTi, $Nb_3Sn$, Nb, PbSn, $MgB_2$, BSCCO, YBCO, or ReBCO.

10. An operating method of a low magnetic field and ultra-low magnetic field nuclear magnetic resonance (NMR) and magnetic resonance image (MRI) apparatus including a SQUID sensor and a prepolarization magnetic field coil, the method comprising:

generating, using the prepolarization magnetic field coil, a prepolarization magnetic field to magnetize a sample;

generating, using the prepolarization magnetic field coil, a counter pulse in a direction opposite to that of the prepolarization magnetic field immediately before or immediately after the prepolarization magnetic field is generated; and measuring, using a pick-up coil, NMR signal from the sample and providing the NMR signal measured by the pick-up coil to the SQUID sensor, wherein the pick-up coil is a type-II superconductor, wherein the pick-up coil is demagnetized by the counter pulse of the prepolarization magnetic field, and wherein unwanted magnetization due to the prepolarization magnetic field is demagnetized by the counter pulse.

11. The operating method of claim 10, wherein the pick-up coil is made from NbTi, $Nb_3Sn$, Nb, PbSn, $MgB_2$, BSCCO, YBCO, or ReBCO.

12. The operating method of claim 10, wherein a magnitude of the counter pulse is set such that magnetization (M) is close to zero at an M-H magnetization loop in a zero magnetic field (H).

* * * * *